(12) United States Patent
Din

(10) Patent No.: US 6,743,734 B2
(45) Date of Patent: Jun. 1, 2004

(54) BI-LAYER RESIST PROCESS

(75) Inventor: Kuen-Sane Din, Hsinchu Hsien (TW)

(73) Assignee: Macronix International Co., Ltd., Hsin-Chu (TW)

(*) Notice: Subject to any disclaimer, the term of this patent is extended or adjusted under 35 U.S.C. 154(b) by 146 days.

(21) Appl. No.: 10/196,291

(22) Filed: Jul. 17, 2002

(65) Prior Publication Data

US 2004/0014326 A1 Jan. 22, 2004

(51) Int. Cl.⁷ .............................................. H01L 21/302
(52) U.S. Cl. ...................... 438/725; 216/47; 430/315
(58) Field of Search ................................ 430/313, 314, 430/315; 438/706, 710, 712, 714, 725; 216/16, 47

(56) References Cited

U.S. PATENT DOCUMENTS

| | | | | |
|---|---|---|---|---|
| 5,286,607 A | * | 2/1994 | Brown | ........................ 430/313 |
| 5,759,748 A | * | 6/1998 | Chun et al. | .................. 430/323 |
| 6,030,541 A | * | 2/2000 | Adkisson et al. | ............. 216/51 |
| 6,143,666 A | * | 11/2000 | Lin et al. | ..................... 438/725 |
| 6,284,149 B1 | * | 9/2001 | Li et al. | ......................... 216/64 |
| 6,589,707 B2 | * | 7/2003 | Lee et al. | ................. 430/270.1 |

* cited by examiner

*Primary Examiner*—Kin-Chan Chen
(74) *Attorney, Agent, or Firm*—Birch, Stewart, Kolasch & Birch, LLP

(57) ABSTRACT

A bi-layer resist process. A layer to be etched is provided on a substrate. The layer to be etched is coated with a bottom silicon-containing resist layer. The bottom silicon-containing resist layer is baked. The bottom silicon-containing resist layer is treated to form a silicon oxide layer on a surface of the bottom silicon-containing resist layer. The silicon oxide layer is coated with a top resist layer. The top resist layer is baked. The top resist layer is exposed to light and developed to form a pattern in the top resist layer. The pattern is transferred through the silicon oxide layer to the bottom resist layer.

21 Claims, 4 Drawing Sheets

BI-LAYER RESIST PROCESS

BACKGROUND OF THE INVENTION

1. Field of the Invention

The present invention relates in general to a method of manufacturing integrated circuits and other electronic devices. In particular, the present invention relates to an improved process for photoresist patterning in the manufacture of integrated circuits and other electronic devices.

2. Description of the Related Art

With the trend toward higher integration and higher functionality of electronic devices, such as semiconductor devices, in recent years, progress continues to be made toward more intricate and multilayered wirings. In the manufacture of second generation semiconductor devices with ever higher integration and higher functionality, research has begun on using ArF excimer lasers and DUV even EUV light as exposure light sources in lithography techniques for intricate working, and progress is being made toward shorter wavelength applications. Problems raised with shorter wavelength light sources include the transmittance of the resist materials and reflection from the substrates, but surface imaging has been proposed as an effective technique to counter these problems, and a particularly effective method is the bi-layer resist method.

According to the bi-layer resist method, an organic resin is coated to a film thickness of 1–2 μm, for example, to form a lower resist layer on which there is formed an upper resist layer of a thin film of about 0.1–0.2 μm, and then the upper resist layer is first patterned by light exposure and development of the upper layer and the resulting upper layer pattern is used as a mask for etching of the lower layer, to form a resist pattern with a high aspect ratio. The bi-layer resist method can alleviate or prevent the influence of level differences in the substrate and reflection from the substrate surface by the lower layer resist, while the small film thickness of the upper layer resist allows improved resolution compared to single-layer resist methods. Consequently, the bi-layer resist method is more advantageous than the single-layer resist method for formation of intricate patterns on substrates with large level differences and it is therefore believed to be a more effective resist process for the shorter wavelengths of exposure light sources which will be used in the future.

U.S. Pat. No. 6,255,022 to Young et al. teach a bi-layer resist with bottom layer for planarizing and top layer containing silicon. However, a disadvantage is possible intermixing of these two resist layers. Also, as soon as the top layer is etched away, the bottom layer cannot bear high physical bombardment during etching, especially for noble metals used in FeRAM.

U.S. Pat. No. 5,922,516 to Yu et al. teach a bi-layer resist with bottom layer for planarizing and top layer subjecting to silylation. However, this method also has the disadvantages mentioned above.

SUMMARY OF THE INVENTION

An object of the present invention is to provide a bi-layer resist process to prevent the two resist layers from intermixing.

Another object of the present invention is to provide a bi-layer resist process, wherein the resist layer can withstand high physical bombardment during etching.

In accordance with the objects of this invention a new bi-layer resist process for semiconductor processing is achieved. A layer to be etched is provided on a substrate. The layer to be etched is coated with a bottom silicon-containing resist layer. The bottom silicon-containing resist layer is baked. The bottom silicon-containing resist layer is treated to form a silicon oxide layer on a surface of the bottom silicon-containing resist layer. The silicon oxide layer is coated with a top resist layer. The top resist layer is baked. The top resist layer is exposed to light and developed to form a pattern in the top resist layer. The pattern is transferred through the silicon oxide layer to the bottom resist layer.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

FIGS. 1A–1F depict a bi-layer resist process for semiconductor processing according to the embodiment of the present invention.

Figure 1A:
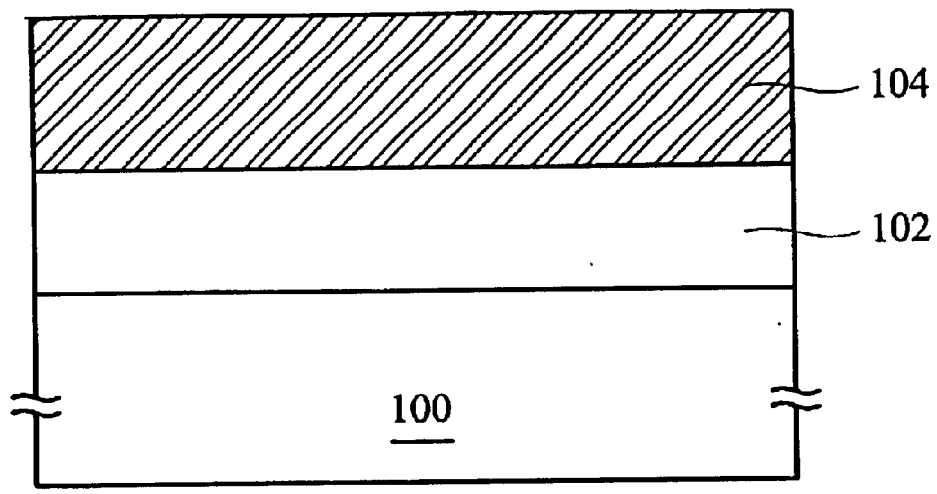
FIGS. 1A–1F depict a bi-layer resist process for semiconductor processing according to the embodiment of the present invention.

Referring to FIG. 1A, a layer 102 to be etched is provided on a substrate 100. The substrate 100 includes semiconductor elements, such as transistors, formed therein, which are not shown in figures. A bottom silicon-containing resist layer 104 is coated on the layer 102 to be etched. The thickness of the bottom silicon-containing resist layer 104 is about 5000–15000 Å. The bottom silicon-containing resist layer 104 is subjected to hard bake, and the temperature used to bake is about 120–180° C.

Figure 1B:
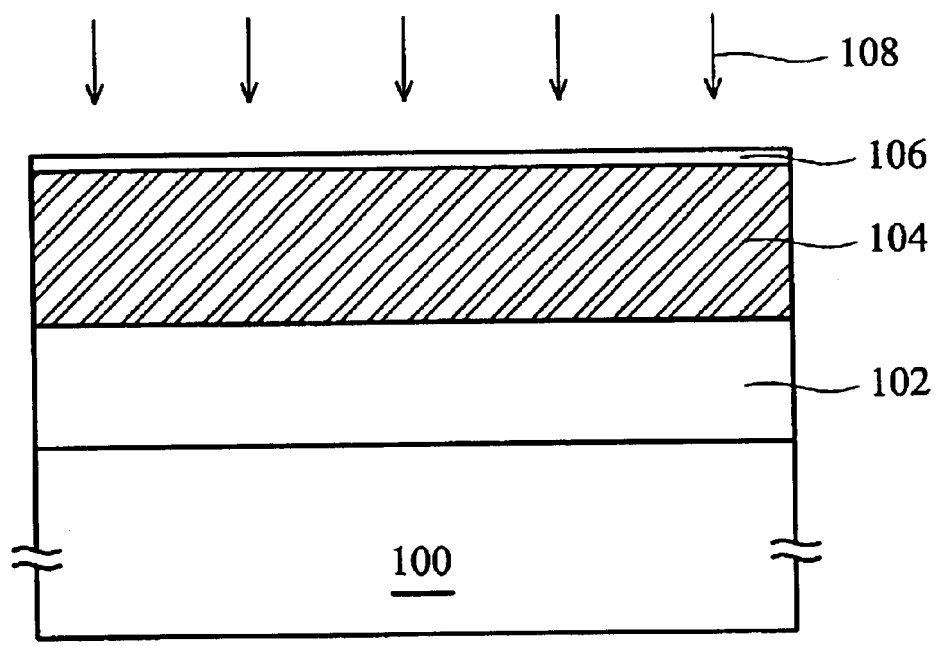

Referring to FIG. 1B, the bottom silicon-containing resist layer 104 is treated to form a silicon oxide layer 106 on a surface of the bottom silicon-containing resist layer 104. The treating method subjects the bottom silicon-containing resist layer 104 to an oxygen-containing plasma 108. The gas used in the oxygen-containing plasma can be $SO_2$, $N_2O$ or CO. The plasma is used at a pressure of about 30–50 mtorr.

Figure 1C:
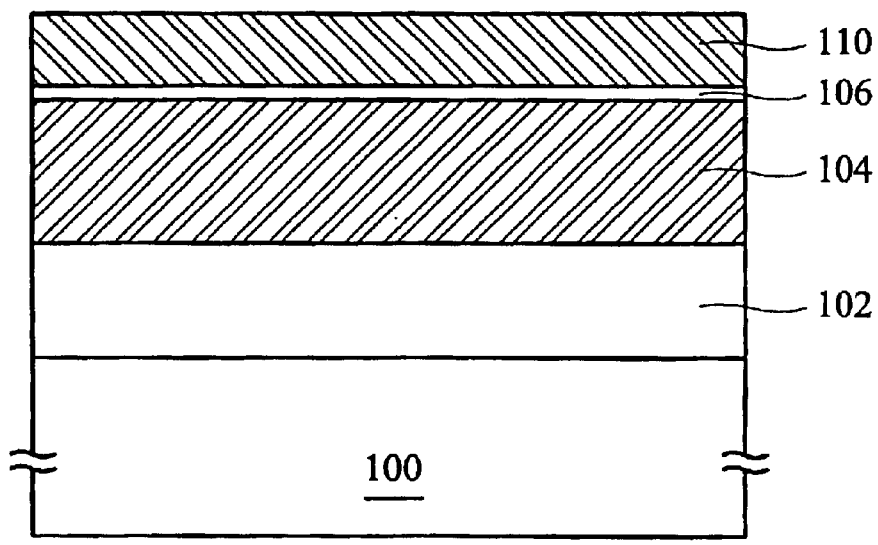

Referring to FIG. 1C, a thin top resist layer 110 is coated on the silicon oxide layer 106. The thickness of the thin top resist layer 110 is 2000–5000 Å. The top resist layer 110 has the benefit of high resolution and DUV or EUV light is used as exposure light source. The top resist layer 110 is then subjected to soft bake.

Figure 1D:
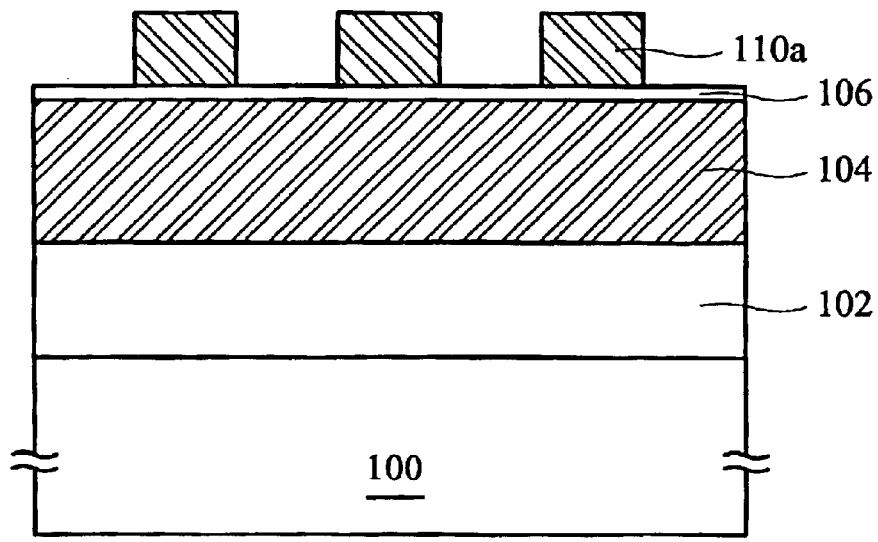

Referring to FIG. 1D, the baked, top resist layer 110 is exposed to light and developed to developer to form a pattern in the top resist layer 110a.

Figure 1E:
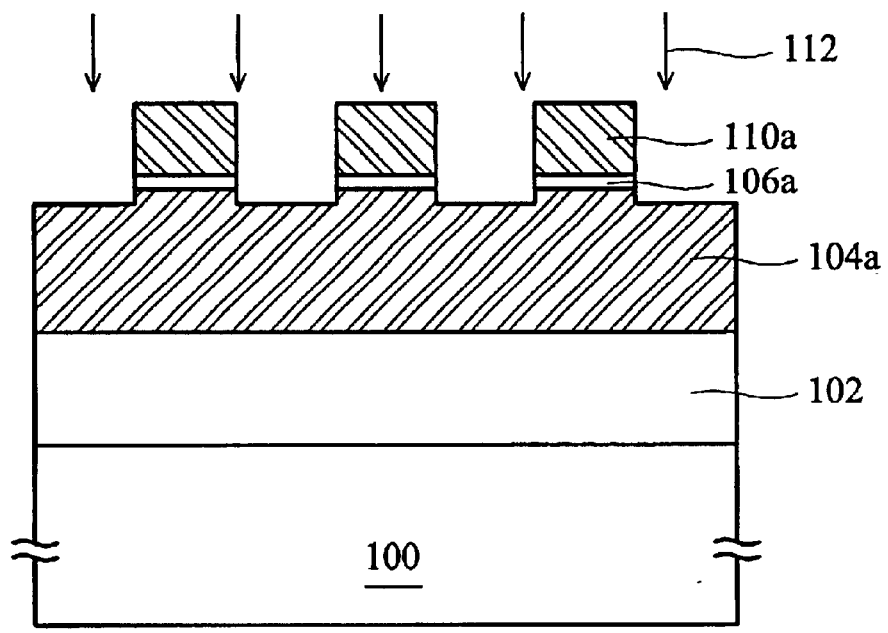
Figure 1F:
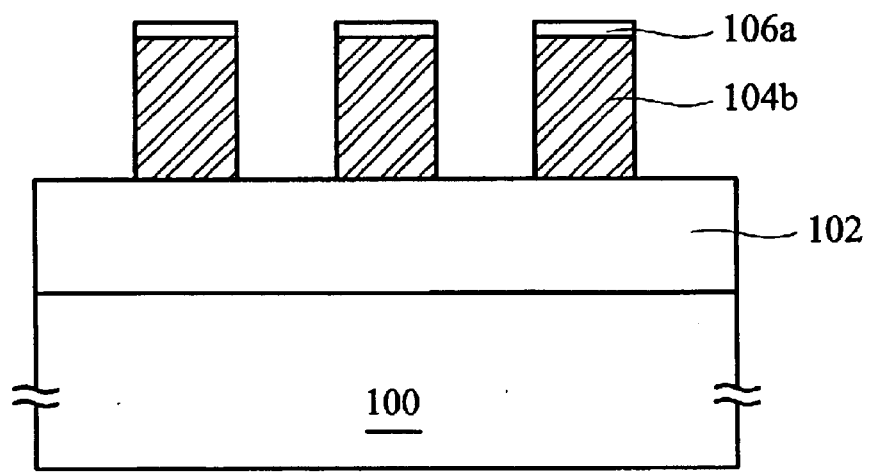

The pattern in the top resist layer 110a is then transferred through the silicon oxide layer 106 to the bottom resist layer 104, as shown in FIGS. 1E and 1F.

As shown in FIG. 1E, the silicon oxide layer 106 is etched using a fluorine and oxygen-containing plasma and transformed into the patterned silicon oxide layer 106a. The fluorine-containing gas used in the fluorine and oxygen-containing plasma can be $CF_4$, $CHF_3$ or $CH_2F_2$ and the oxygen-containing gas used in the fluorine and oxygen-containing plasma can be $SO_2$, $N_2O$ or CO.

The bottom resist layer 104 may be lost in the first plasma etching step, and become the partially etched bottom resist layer 104a as shown in FIG. 1E.

As shown in FIG. 1F, the bottom resist layer 104a is etched through using an oxygen-containing plasma and transformed into the patterned bottom resist layer 104b. The oxygen-containing gas used in the oxygen-containing plasma can be $SO_2$, $N_2O$ or CO.

In the bottom resist etching through step, the top resist layer 110a may be lost. The silicon oxide layer 106a on the surface of the bottom resist layer 104b can withstand the resist etching.

When the pattern continues transference to the layer 102 by dry etching, the silicon oxide layer 106a and the bottom resist layer 104b function as etch masks. The silicon oxide layer 106a works like a hard mask and, therefore, the thickness of the bottom resist layer 104b can be reduced without affecting the following etching.

The above-mentioned bi-layer resist process can be applied to a capacitor processing, such as the FeRAM (Ferroelectric RAM) process.

Figure 2:
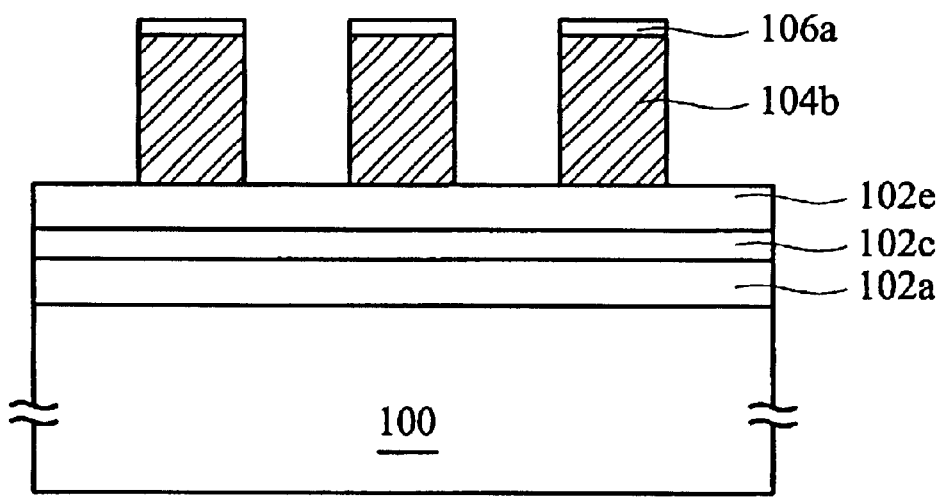
FIG. 2 depicts the capacitor process applying the bi-layer resist process.

As shown in FIG. 2, when the bi-layer resist process is applied to the capacitor process, the layer 102 to be etched is a stacked layer comprising a top electrode layer 102e, an insulating layer 102c (such as an insulating ferroelectric layer) and a bottom electrode layer 102a to form a capacitor.

Figure 3:
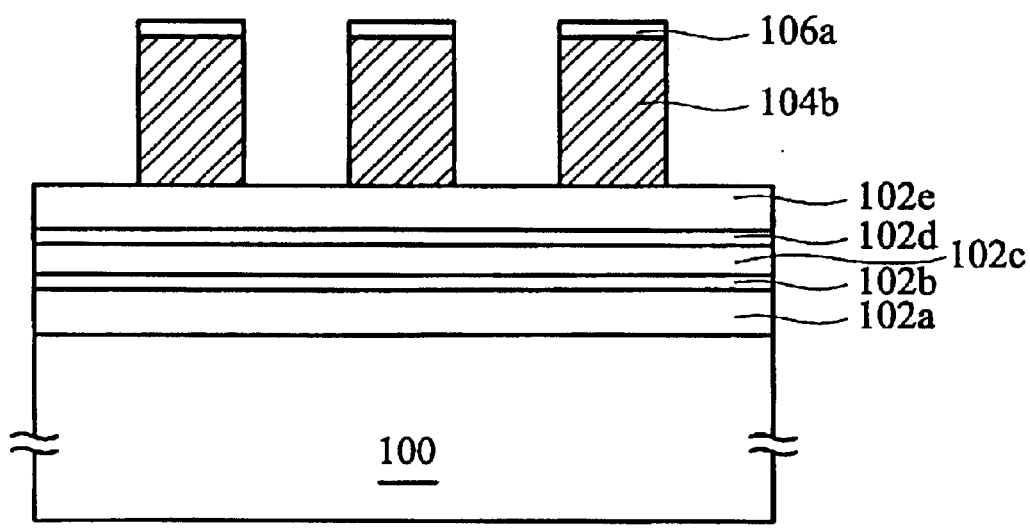
FIG. 3 depicts the FeRAM process applying the bi-layer resist process.

As shown in FIG. 3, when the bi-layer resist process is applied in the FeRAM process, the capacitor is a FePAM capacitor, the stacked layer further comprises an upper barrier layer 102d between the top electrode layer 102e and the insulating layer 102c, and a lower barrier layer 102b between the bottom electrode layer 102a and the insulating layer 102c. The top electrode layer can be Pt, Ir, $IrO_x$, $SrRuO_x$, $RuO_x$ or $LaNiO_x$, the insulating layer can be PZT ($PbZrTiO_x$) or SBT ($SrBiTaO_x$), and the bottom electrode layer can be Pt, Ir, $IrO_x$, $SrRuO_x$, $RuO_x$ or $LaNiO_x$. The upper barrier layer 102d and the lower barrier layer 102b can be Ti/TiN stacked layer.

For FeRAM fabrication, etching the ferroelectric capacitor is the most critical process. The stacked capacitor film contains novel metal and ferroelectric insulator, so the etching selectivity of this kind of material versus resist is low. Traditionally, thicker resist layer is needed. However, thicker resist layer will not only create serious veil or fence problems, but also poor resolution. In the present invention, the silicon oxide layer covers the bottom resist layer as a hard mask, therefore etching selectivity can be improved. The silicon oxide layer can withstand the capacitor etching, so the thickness of the bottom resist layer can be reduced and the veil or fence problem can be reduced.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A bi-layer resist process, comprising:
   providing a layer to be etched on a substrate;
   coating a bottom silicon-containing resist layer on the layer to be etched;
   baking the bottom silicon-containing resist layer;
   treating the bottom silicon-containing resist layer to form a silicon oxide layer on a surface of the bottom silicon-containing resist layer;
   coating a top resist layer on the silicon oxide layer;
   baking the top resist layer;
   exposing the top resist layer to light and developing the exposed resist layer of form a pattern in the top resist layer; and
   transferring the pattern through the silicon oxide layer to the bottom resist layer.

2. The bi-layer resist process as claimed in claim 1, wherein the temperature used to bake the bottom silicon-containing resist layer is 120–180° C.

3. The bi-layer resist process as claimed in claim 1, wherein the thickness of the bottom silicon-containing resist layer is 5000–15000 Å.

4. The bi-layer resist process as claimed in claim 1, wherein the step of forming the silicon oxide layer comprises subjecting the bottom silicon-containing resist layer to an oxygen-containing plasma.

5. The bi-layer resist process as claimed in claim 4, wherein the gas used in the oxygen-containing plasma is $SO_2$, $N_2O$ or CO.

6. The bi-layer resist process as claimed in claim 4, wherein the plasma is used at a pressure of about 30–50 mtorr.

7. The bi-layer resist process as claimed in claim 1, wherein the step of transferring the pattern through the silicon oxide layer to the bottom resist layer comprises:
   etching the silicon oxide layer using a fluorine and oxygen-containing plasma; and
   etching the bottom resist layer using an oxygen-containing plasma.

8. The bi-layer resist process as claimed in claim 7, wherein the fluorine-containing gas used in the fluorine and oxygen-containing plasma is $CF_4$, $CHF_3$ or $CH_2F_2$.

9. The bi-layer resist process as claimed in claim 7, wherein the oxygen-containing gas used in the fluorine and oxygen-containing plasma or the oxygen-containing plasma is $SO_2$, $N_2O$ or CO.

10. The bi-layer resist process as claimed in claim 1, wherein the layer to be etched is a stacked layer comprising a top electrode layer, an insulating layer and a bottom electrode layer to form a capacitor.

11. The bi-layer resist process as claimed in claim 10, wherein the capacitor is a FeRAM capacitor, the stacked layer further comprises an upper barrier layer between the top electrode layer and the insulating layer, and a lower barrier layer between the bottom electrode layer and the insulating layer.

12. The bi-layer resist process as claimed in claim 11, wherein the top electrode layer is Pt, Ir, $IrO_x$, $SrRuO_x$, $RuO_x$ or $LaNiO_x$, the insulating layer is PZT ($PbZrTiO_x$) or SBT ($SrBiTaO_x$), and the bottom electrode layer is Pt, Ir, $IrO_x$, $SrRuO_x$, $RuO_x$ or $LaNiO_x$.

13. A bi-layer resist process, comprising:
   providing a layer to be etched on a substrate;
   coating a bottom silicon-containing resist layer on the layer to be etched;
   baking the bottom silicon-containing resist layer;
   treating the bottom silicon-containing resist layer with an oxygen-containing plasma to form a silicon oxide layer on a surface of the bottom silicon-containing resist layer;

coating a thin top resist layer on the silicon oxide layer;

baking the top resist layer;

exposing the top resist layer to light and developing the exposed resist layer to form a pattern in the top resist layer; and etching through the silicon oxide layer using a fluorine and oxygen-containing plasma to transfer the pattern to the silicon oxide layer; and etching through the bottom resist layer using an oxygen-containing plasma to transfer the pattern to the bottom resist layer and removing the top resist layer.

14. The bi-layer resist process as claimed in claim 13, wherein the temperature used to bake the bottom silicon-containing resist layer is 120–180° C.

15. The bi-layer resist process as claimed in claim 13, wherein the thickness of the bottom silicon-containing resist layer is 5000–15000 Å.

16. The bi-layer resist process as claimed in claim 13, wherein the gas used in the oxygen-containing plasma is $SO_2$, $N_2O$ or CO and the plasma is used at a pressure of about 30–50 mtorr.

17. The bi-layer resist process as claimed in claim 13, wherein the fluorine-containing gas used in the fluorine and oxygen-containing plasma is $CF_4$, $CHF_3$ or $CH_2F_2$.

18. The bi-layer resist process as claimed in claim 13, wherein the oxygen-containing gas used in the fluorine and oxygen-containing plasma or the oxygen-containing plasma is $SO_{21}$, $N_2O$ or CO.

19. The bi-layer resist process as claimed in claim 13, wherein the thickness of the top resist layer is 2000–5000 Å.

20. The bi-layer resist process as claimed in claim 13, wherein the layer to be etched is a stacked layer comprising a top electrode layer, an insulating layer and a bottom electrode layer using to form a capacitor.

21. The bi-layer resist process as claimed in claim 20, wherein the capacitor is a FeRAM capacitor, the stacked layer further comprises an upper barrier layer between the top electrode layer and the insulating layer, and a lower barrier layer between the bottom electrode layer and the insulating layer.

* * * * *